United States Patent [19]

Haywood

[11] Patent Number: 6,034,522
[45] Date of Patent: Mar. 7, 2000

[54] FIBRE OPTIC TRANSDUCER INCORPORATING AN EXTRANEOUS FACTOR COMPENSATION REFERENCING SYSTEM

[75] Inventor: John Haywood, East Gosford, Australia

[73] Assignee: The University of Sydney, Australia

[21] Appl. No.: 08/973,339

[22] PCT Filed: Mar. 30, 1996

[86] PCT No.: PCT/AU96/00330

§ 371 Date: May 16, 1998

§ 102(e) Date: Mar. 16, 1998

[87] PCT Pub. No.: WO96/38735

PCT Pub. Date: Dec. 5, 1996

[30] Foreign Application Priority Data

May 31, 1995 [AU] Australia ................................ PN3292

[51] Int. Cl.[7] ........................ G01R 33/232; G01R 15/27; G01R 19/00; G01J 9/02
[52] U.S. Cl. .......................... 324/96; 324/244.1; 359/280
[58] Field of Search ................................... 324/96, 244.1; 250/205, 227.4, 227.17, 227.24; 356/345, 351, 364, 365, 368; 359/281, 284, 280

[56] References Cited

U.S. PATENT DOCUMENTS 4,370,612  1/1983  Puech et al. ..................... 324/117 R
4,686,371  8/1987  Birch et al. ........................ 250/461.1

FOREIGN PATENT DOCUMENTS

| 0 290 780 | 4/1988 | European Pat. Off. ........ G01R 15/07 |
| 2 475 230 | 2/1980 | France ........................... G01R 15/07 |
| 2 251 940 | 7/1992 | United Kingdom ......... G01R 33/032 |
| WO 93/13428 | 7/1993 | WIPO ........................... G01R 15/07 |
| WO 94/23306 | 10/1994 | WIPO ........................... G01R 15/07 |

*Primary Examiner*—Walter E. Snow
*Attorney, Agent, or Firm*—Fulwider Patton Lee & Utecht, LLP

[57] ABSTRACT

The fiber optic transducer may take the form of a current sensor, and includes a first light path which is defined by a light transmitting element (19) and a second light path which is defined by a coil (10) of optical fiber (11). The coil-forming optical fiber (11) has a length which is significantly greater than that of the light transmitting element (19). A modulated light source (14) is provided for directing light simultaneously into both the first and second light paths. Also, the transducer includes detector/processing circuitry (15 to 17 and 20 to 24) for detecting light exiting from the light paths during successive time periods that include first and second time intervals $t_1$ and $t_2$. The detector/processing circuitry includes apparatus for referencing the level of light that exits from the coil (10) with respect to that which exits from the light transmitting element (19) and, to this end, use is made of the difference in transmission time of light through the first and second light path having the significantly different lengths.

17 Claims, 5 Drawing Sheets

FIBRE OPTIC TRANSDUCER INCORPORATING AN EXTRANEOUS FACTOR COMPENSATION REFERENCING SYSTEM

FIELD OF THE INVENTION

This invention relates to a transducer which incorporates a coil of optical fibre and, in one of its aspects, to a transducer that provides for referencing of optical signals that pass through the coil. The invention has been developed in the context of a fibre optic transducer that is employed for sensing the magnitude of electric current flow through a conductor and the invention is hereinafter described in relation to such a transducer. However, it will be understood that the invention does have broader application, to any transducer that incorporates an optical fibre having a length sufficient to provide a discernible light transmission time.

BACKGROUND OF THE INVENTION

Fibre optic current sensors typically are employed in high voltage electricity generating/distribution systems, and they make use of the Faraday effect to provide a measure of current flow through a conductor. Counter-propagating light signals are directed into opposite ends of a coil of the optical fibre that surrounds the current conductor and signal detecting/processing circuitry is provided to detect a phase shift between the polarisation modes of the counter-propagated light beams. This is achieved alternatively by using a polarising beam splitter and detecting directly for the phase shift or by inferring the phase shift from the interference of the counter-propagating light beams in a coupling device.

The current sensors rely upon the accurate measurement of the optical power levels of the light signals that have counter-propagated through the coil. However, the power levels are influenced not only by the electric current but, also, by changes in power level of the light source and by attenuation in the optical fibre leading to and from the coil. Also, electronic processing and measurement of the optical signals may give rise to errors due to changes in receiver sensitivity, amplifier gain and offset. Therefore, to stabilise absolutely the measurement of optical power levels would be an impossible task, even if consideration was to be given only to one or two influencing factors such as temperature induced variations and aging effects.

SUMMARY OF THE INVENTION

The present invention seeks to avoid these problems by providing a referencing system which is arranged to compensate for extraneous influencing factors and which makes use of the difference in transmission times of light through light paths that have significantly different path lengths.

Thus, the invention may be defined broadly as providing a transducer which comprises a first light path which is defined by a light transmitting element and a second light path which is defined by an optical fibre, the optical fibre defining the second light path having a length which is significantly greater than that of the light transmitting element which defines the first light path. A light source is provided for directing light simultaneously into both the first and the second light paths, and means are provided for cyclically modulating the light from the source between upper and lower levels. Also, means are provided for detecting for light exiting from the two light paths during successive time periods that include a first time interval in which light exits from the first light path only and a second time interval in which light exits from the second light path only, and further means are provided for referencing the level of light that exits from one of the paths with respect to the level of the light that exits from the other path.

Referencing may be made with respect to light that exits from either the first or the second light path, depending upon the construction and application of the transducer. That is, if the optical fibre which defines the second light path is wound into a coil and the coil is employed, for example, as a sensing coil in the transducer, the relatively short light transmitting element may be employed as the reference path. However, where a relatively short length of optical fibre is employed as or in conjunction with a sensing element (for example in conjunction with a glass sensing prism), the optical fibre forming the second light path may be wound as a coil and be employed as the reference path. In both cases, use is made of the longer light transmission time of the coil, this enabling the recovery of light exiting from the second light path after light has ceased to exit from the first light path.

PREFERRED FEATURES OF THE INVENTION

In order clearly to delineate between light exiting from the two light paths, light from the source is preferably modulated to 100% depth with a square wave. The modulation frequency will be determined in part by the relative lengths of the first and second light paths. As the difference in length of the two paths is decreased, the modulation frequency will need be increased to provide a discernible separation between the abovementioned first and second time intervals.

The light transmitting element that defines the first light path preferably comprises a length of optical fibre and most preferably comprises a length of standard single mode fibre.

As indicated above, the optical fibre which defines the second light path is preferably wound into a coil as a convenient way of holding a relatively long length of the optical fibre.

When in the form of a current sensor, the transducer of the present invention preferably comprises a sensor element in the form of a coil of optical fibre which is arranged in use to surround a current carrying conductor. A light transmitting device is connected with the ends of the coil-forming optical fibre and is arranged to launch counter-propagating light beams into the respective ends of the coil-forming optical fibre. A modulated light source is connected optically in circuit with the light transmitting device, and a detector which is arranged to detect a phase shift between the polarisation modes of the counter-propagated light beams is also connected to the ends of the coil-forming optical fibre by way of the light transmitting device. A light transmitting element that defines a reference light path is also connected optically to the light source and the detector. The light transmitting element has an effective path length which is significantly smaller than that of the coil-forming optical fibre, whereby light which exits from the coil and the reference light path will be detected during successive time periods that include a first time interval in which light exits from the reference light path only and a second time interval in which light exits only from the coil. The detector is arranged to reference the level of light that exits from the coil during the second interval of each time period with respect to the level of light that exits from the reference light path during the first interval of each time period.

The light transmitting element that defines the reference light path preferably comprises a length of optical fibre and the coil-forming optical fibre preferably comprises a spun birefringent optical fibre.

The light transmitting device employed within the current sensor may comprise a plurality of 2×2 couplers connected in a configuration appropriate to the required transmission of light within the current sensor. When employing 2×2 couplers for recombining light that has counter-propagated through the coil, the detector will function to receive and process signals which have a 180° phase relationship in the absence of a phase shift between the polarisation modes of the counter-propagated light modes.

However, the light transmitting device preferably comprises a 3×3 coupler for recombining the light that has counter-propagated through the coil. In this preferred arrangement the 3×3 coupler will be employed to direct light from the light source into the opposite ends of the coil-forming optical fibre and to direct the counter-propagated light from the coil to the detector. Then, the detector will function to receive and process signals which have a 120° phase relationship in the absence of a phase shift between the polarisation modes of the counter-propagated light modes.

A 2×2 coupler may be used in conjunction with the 3×3 coupler and be employed to direct light from the source to the 3×3 coupler and, preferably, through both the reference path and the sensing coil.

In the latter arrangement, the optical fibre forming the reference path may be connected as a loop between the 2×2 and the 3×3 couplers. However, in the interest of minimising the risk of closed loop interference between light which exits from the coil and light emitted by the source, the optical fibre forming the reference path may be and preferably is connected to one limb of the 3×3 coupler to form a two-way path along which light from the source is transmitted and reflected.

The invention will be more fully understood from the following description of alternative embodiments of the invention. The description is provided with reference to the accompanying drawings.

DETAILED DESCRIPTION OF MODES OF PERFORMING THE INVENTION

Figure 1:
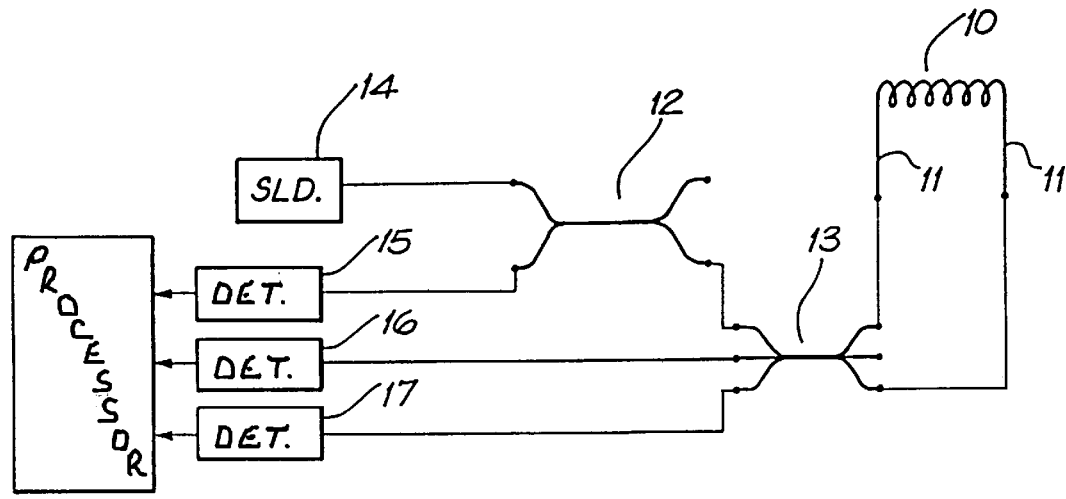
FIG. 1 shows a diagrammatic representation of a prior art current sensor.

As illustrated in FIG. 1, the prior art current sensor comprises a coil 10 of spun, single mode birefringent optical fibre 11. The coil 10 typically has a length in the order of 50 cm, a diameter of 10 cm and is wound with optical fibre having a length in the order of 100 m to 500 m. In use of the sensor the coil 10 is located concentrically about a conductor (not shown) through which current normally flows.

The coil-forming fibre 11 typically comprises a bowtie optical fibre having a core diameter in the order of 4 to 10 $\mu$m and a cladding diameter in the order of 80 to 120 $\mu$m. Also, the fibre typically has a spun pitch length of approximately 5 mm and an unspun beat length of approximately 2.5 mm.

A 2×2 coupler 12 and a 3×3 coupler 13 are used for coupling light from a single source 14 to the two ends of the coil fibre 11 and for coupling three detector devices 15, 16 and 17 to the ends of the coil fibre.

The light source 14 comprises a solid state laser diode which may have a lasing wavelength in the order of 670 nm and, although not shown, an isolator may be provided to prevent reflections back into the light source. Light from the light source 14 is split by the coupler 13 into two counter-propagating beams which enter the respective ends of the coil fibre 11.

The counter-propagated light emerging from the coil 10 is directed to the detectors 15, 16 and 17 by way of the 3×3 coupler 13 and this arrangement permits the magnitude and direction of current flowing through the conductor to be inferred from the output from the coil 10. Fringe counting is then performed in a processor 24, using discriminators and combinational logic which is provided to count fringes and choose the optimum region for fringe interpolation. The discriminators provide a predetermined number of pulses per fringe and the order in which the discriminators trigger is dependent upon the current direction. From this information, the fringe counting produces an 8-bit number corresponding to a coarse measure of the current. Fine resolution within each fringe section is provided by an analogue-to-digital converter which measures the voltage of the fringe selected by asynchronous timing networks. The analogue-to-digital converter has a predetermined number of quantisation levels over the full voltage range of the signal and a majority of these levels fall within discriminator levels between which the interpolation is made. The outputs from the fringe counting network and the analogue-to-digital converter are applied to a lookup table from which an output having 16-bit resolution and linearity is derived.

As stated previously, the above described prior art current sensor relies upon accurate determination of the optical power levels in the signals that are applied to the detectors 15 to 17. These power levels are influenced by extraneous factors as well as the current which is sensed by the coil 10, and no provision exists in the prior art for accommodating the extraneous influences.

However, the modified forms of current sensor as shown in FIGS. 2, 4, 5 and 6 incorporate a referencing system which functions continuously to adjust for extraneous factors during normal operation of the sensor.

Figure 2:
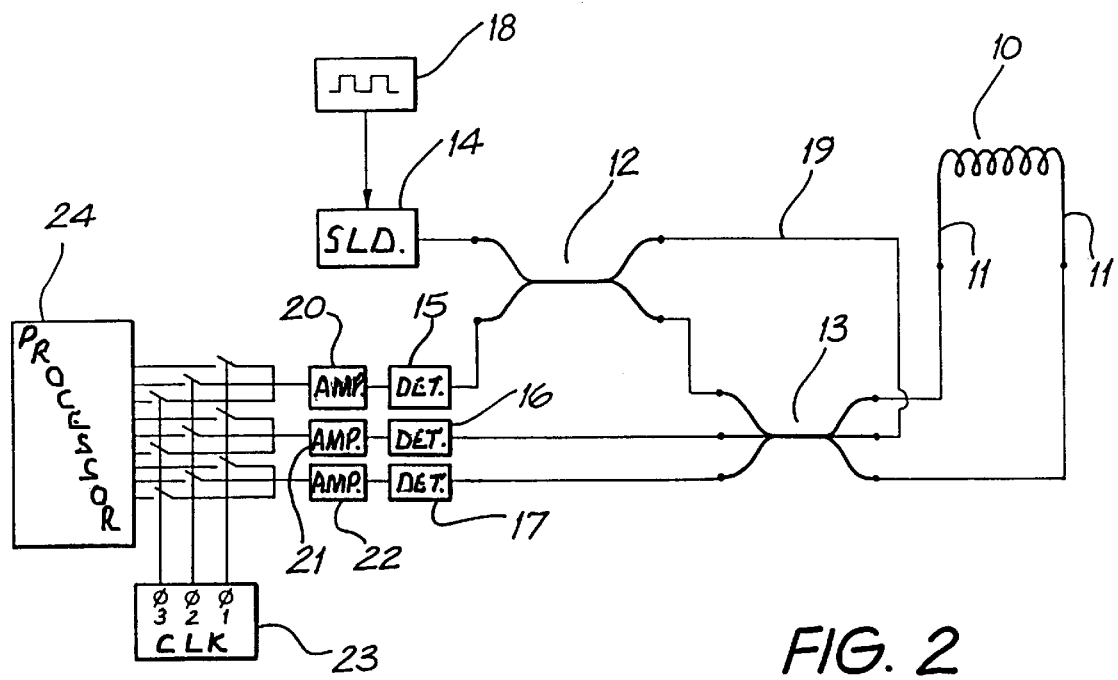
FIG. 2 shows a similar view of a preferred form of a current sensor which embodies the present invention and which distinguishes over the prior art, FIG. 3 provides a graphical representation of the timing of signals that are generated in the current sensor of FIG. 2.

As illustrated in FIG. 2, the current sensor includes the various elements as shown in FIG. 1 and like reference numerals are employed to identify like parts. However, the sensor shown in FIG. 2 incorporates a modulator 18 which is arranged to modulate the light source 14 to a 100% depth with a square wave, and a further length of optical fibre 19 is provided to join the 2×2 and 3×3 couplers 12 and 13, using the arms which are unused in the prior art sensor shown in FIG. 1.

The optical fibre 19 comprises standard single mode fibre and it forms a reference loop which has a length which is very much shorter than the length of fibre which is employed in winding the coil. Thus, whereas the coil may be wound with up to 500 m of optical fibre, that which forms the reference loop may have a length in the order of 2 cm to 4 cm, so that the length of the optical fibre in the sensing coil 10 will be in the order of 2,500 to 25,000 times longer than that of the optical fibre 19 that forms the reference loop.

In the current sensor arrangement shown in FIG. 2, as a result of the light source 14 being modulated by the modulator 18, the output signals from amplifiers 20 to 22 that follow the detectors 15 to 17 have four well defined levels:

Level 1—When the light source 14 is turned on (i.e., when the modulator goes HIGH), the optical signal will travel through both the coil-forming fibre 11 and the reference loop fibre 19. The length of coil-forming fibre 11 delays exiting of the (counter-propagated) signals by a discernible amount equal to 5.L $\mu$s, where L is the length of the coil-forming fibre expressed in km. In contrast, the light travelling through the reference loop fibre 19 will experience effectively zero delay, due to the insignificant length of the reference loop fibre 19 relative to the length of the coil-forming fibre 11. Thus, for a first time interval $t_1$=5.L $\mu$s, only the reference signal (which is identified as $P_r$ in FIG. 3) is seen at the detector end of the optical path.

Level 2—Whilst output from the light source 14 remains high, the signal that has passed through the coil-forming fibre 11 arrives at the detector end of the optical system and is superimposed on the reference signal. This signal, which varies with current and which is identified as $P_d$ in FIG. 3, is discarded.

Level 3—When the light source 14 is turned off (i.e., when the modulator goes LOW), the signal travelling through the reference loop fibre 19 is immediately extinguished, but the signal travelling through the coil-forming fibre 11 continues for a second time interval $t_2$=5.L $\mu$s. The resultant signal as seen at the detector end of the optical system is identified in FIG. 3 as $P_s$.

Level 4—During a further time period, which commences at 5.L $\mu$s after the light source 14 has been turned off, all optical signals from the system are extinguished. The level at which this occurs is measured at the detector end of the optical system and, as indicated in FIG. 3, is defined as $P_g$.

Figure 3:
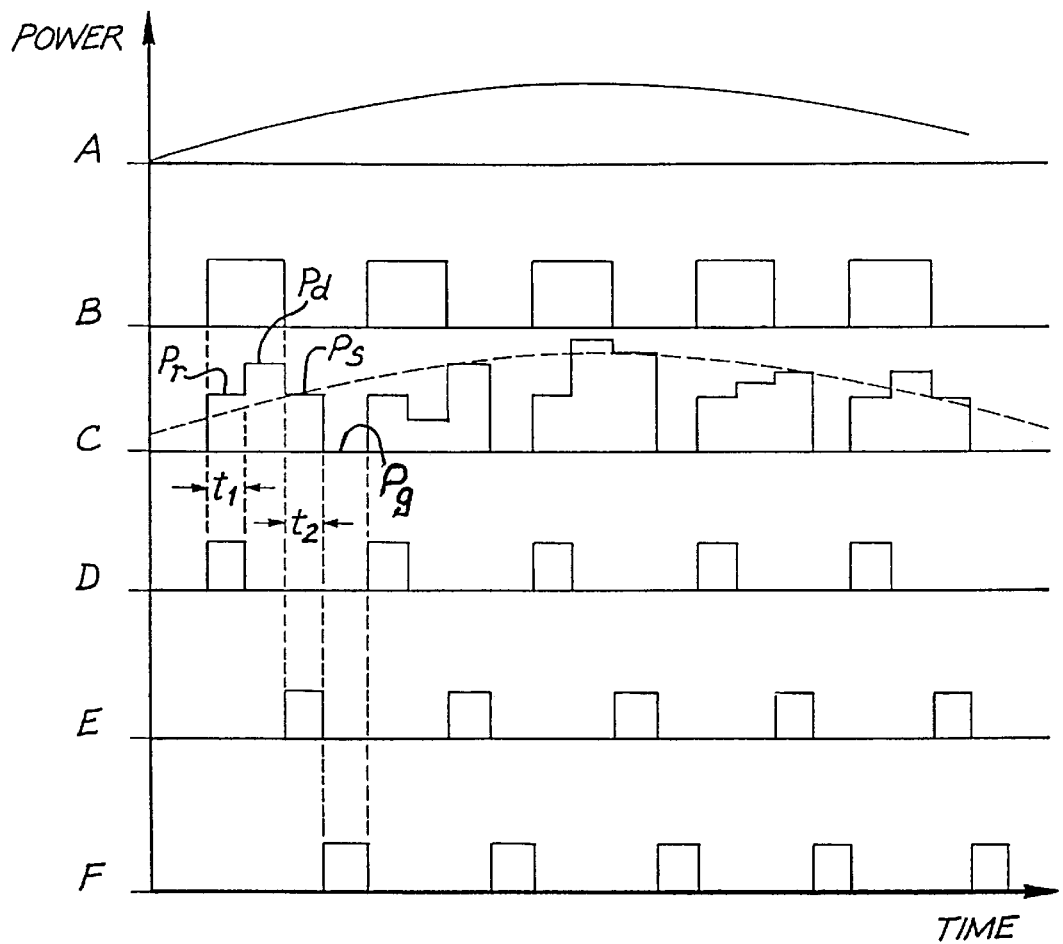

Timing diagrams applicable to the above described output conditions are shown in FIG. 3 in which:

Diagram A shows a typical signal from one of the amplifiers 20 to 22 when no referencing is employed, that is in operation of the prior art system shown in FIG. 1, Diagram B shows the modulated output light signal from the light source 14 and Diagram C shows in outline the formation of a signal which is derived from one of the amplifiers when referencing is employed, Diagrams D, E and F show outputs that are generated by a clock generator 23 which is employed for controlling timed admission of the signals from the amplifiers 20 to 22 to a following signal processing stage 24.

In order to complete the measurement provided by the system, the referencing is applied to the measurement and the result calculated as $$P_{sig\,ref} = \frac{P_S - P_g}{P_r - P_g}$$

where $P_{sig\,ref}$ is the output signal with referencing applied.

This computational process is repeated for each sample of the detected optical signal.

Figure 4:
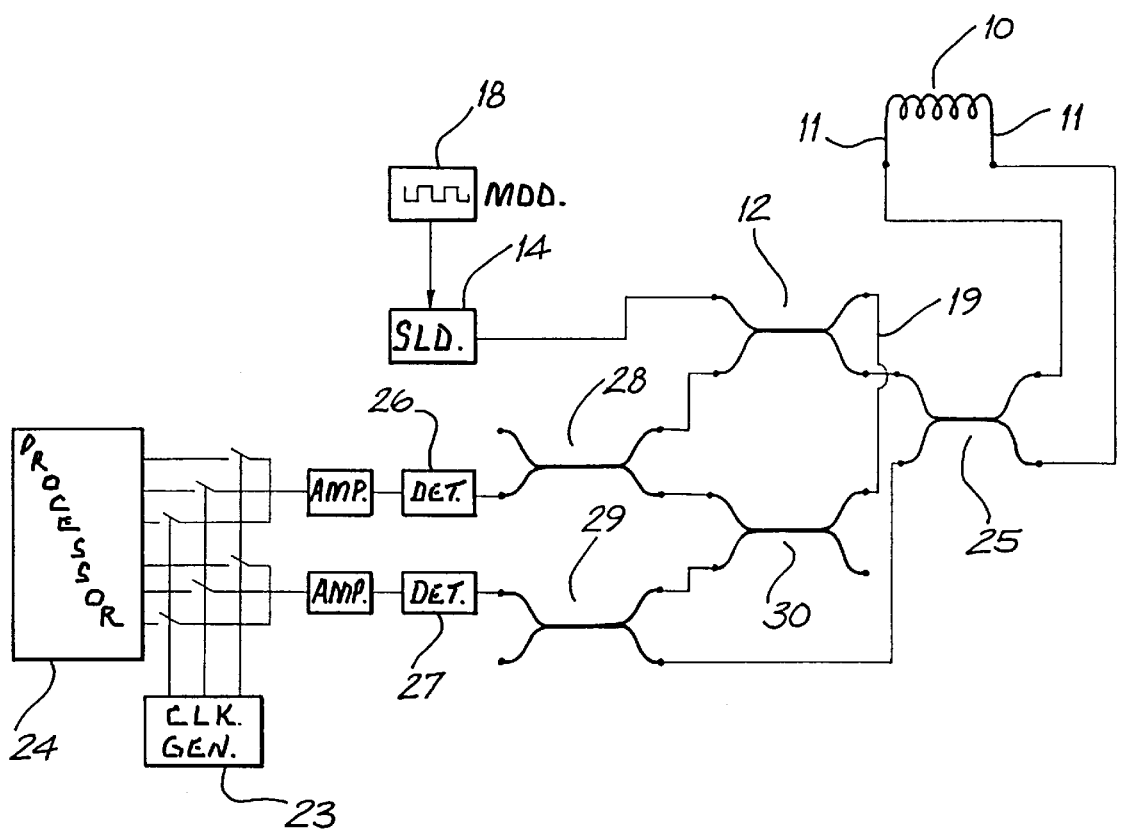
FIG. 4 shows a diagrammatic representation of a second embodiment of the current sensor of the present invention.

The invention has application in transducers that are different from that shown in FIG. 2. For example, the invention has application to a system that employs a network of 2×2 couplers as shown in FIG. 4. This system involves much the same operating (referencing) principles as employed in the arrangement shown in FIG. 2 and, here again, like reference numerals are used to identify like components. However, in the case of the FIG. 4 arrangement, light is directed into the coil-forming fibre 11 from the modulated light source 14 by way of two 2×2 couplers 12 and 25. Also, counter-propagated light that exists from the coil-forming fibre 11 is directed to two detector stages 26 and 27 by two 2×2 couplers 28 and 29. As in the case of the arrangement described with reference to FIG. 2, fringe counting is then performed using discriminators and combinational logic which is provided to count fringes and choose the optimum region for fringe interpolation.

A reference loop 19 is established between the coupler 12 and a further 2×2 coupler 30.

Figure 5:
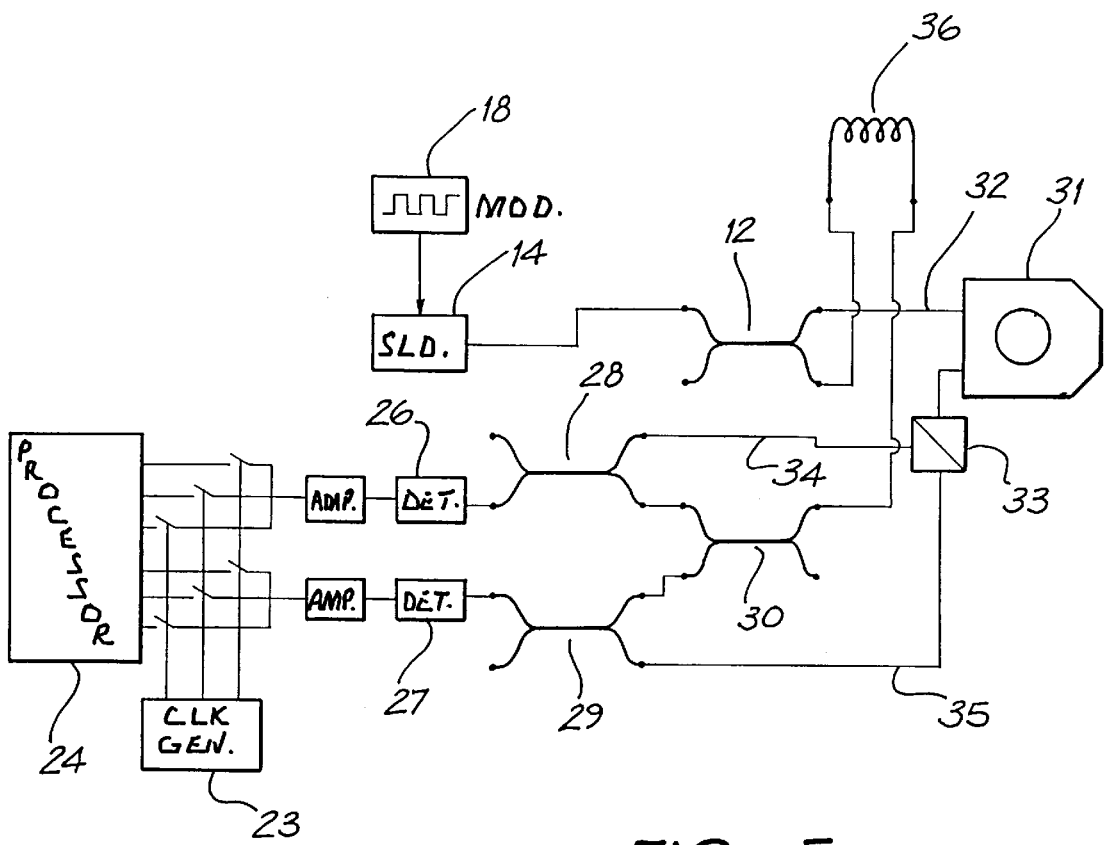
FIG. 5 shows a diagrammatic representation of a third embodiment of the current sensor that embodies the present invention.

FIG. 5 of the drawings shows a further embodiment of the invention which uses 2×2 couplers in much the same manner as the arrangement shown in FIG. 4, but the system shown in FIG. 5 employs a glass sensing prism 31 as an alternative to the sensing coil 10 which is incorporated in the embodiments of the invention that are illustrated in FIGS. 2 and 4 of the drawings.

In the system shown in FIG. 5 light from the modulated source 14 is directed into the prism 31 by way of the coupler 12 and a short length of optical fibre 32. Light exiting from the sensing prism 31 is then directed through a polarising beam splitter 33 into two short lengths of optical fibre 34 and 35. The split beams of light are then directed to the detector/processing circuitry 26 and 27 as described above by way of 2×2 couplers 28 and 29.

This system does not use counter-propagating signals as in the previous embodiments. Rather, the phase shift between the polarisation modes of the optical signal which passes through the prism 31 is measured by evaluating the output polarisation state. To accomplish this, the optical signal is split into the horizontal polarisation component and the vertical polarisation component using the beam splitter 33. From the power level in these two components the polarisation state and, thus, the magnitude of the sensed current may be determined.

Because the polarimetric current sensing arrangement shown in FIG. 5 incorporates a sensing prism as an alternative to a coil of optical fibre, the path length for light directed to the sensing prism is relatively short and, in order to achieve referencing in this embodiment, a reference-delay coil 36 is provided between the 2×2 coupler 12 and the further 2×2 coupler 30. With this arrangement the light path length and hence transmission delay in the reference coil 36 is significantly different from the path length through the sensing prism 31, and a signal reference is provided for the signal that is counter-propagated through the sensing prism.

Figure 6:
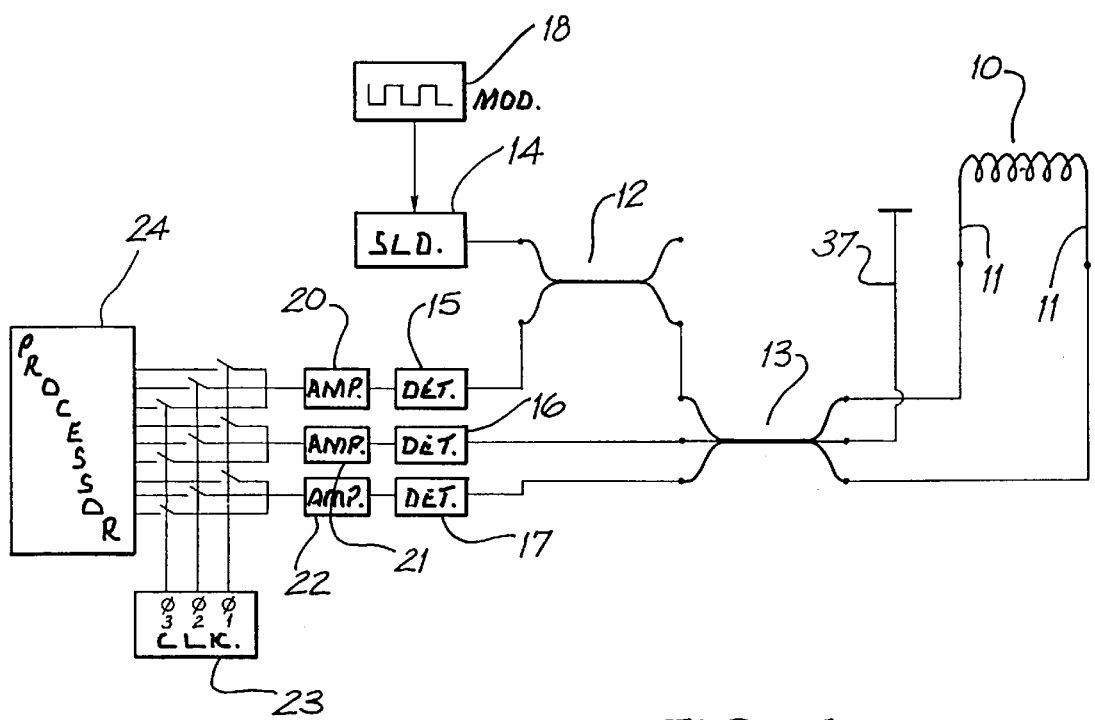
FIG. 6 shows a diagrammatic representation of a fourth embodiment of the current sensor that incorporates the present invention.

Reference is now made to FIG. 6 of the drawings, which shows a current sensor which is similar to that which is illustrated in FIG. 2 and in which like reference numerals are employed to identify like parts. However, instead of using a loop of optical fibre to form the reference path as indicated by numeral 19 in FIG. 2, in the sensor which is shown in FIG. 9 a short length 37 of optical fibre is connected optically in circuit with both the light sensor 14 and the detector system 15 to 17 by way of the 2×2 and 3×3 couplers 12 and 13. Light from the source 14 is launched into the reference path 37 and is reflected back along the same path for transmission to the detector system, and this arrangement avoids the possibility of interference that might affect detection at the detector 15, resulting from light movement through the closed loop arrangement shown in FIG. 2. The free end of the reference path-defining fibre 37 is coated with a reflective coating.

I claim:

1. A transducer which comprises: a first light path which is defined by a light transmitting element, a second light path which is defined by an optical fibre, the optical fibre defining the second light path having a length which is significantly greater than that of the light transmitting element which defines the first light path, a light source arranged to direct light simultaneously into both the first and the second light paths, means for cyclically modulating the light from the source between upper and lower levels, means for detecting for light exiting from the two light paths during successive time periods that include a first time interval in which light exits from the first path only and a second time interval in which light exits from the second path only, and means for referencing the level of light that exits from one of the paths with respect to the level of light that exits from the other path.

2. The transducer as claimed in claim 1, wherein the light transmitting element that defines the first light path comprises a length of optical fibre which forms a reference light path.

3. The transducer as claimed in claim 1 or claim 2 wherein the optical fibre that defines the second light path is wound as a coil.

4. The transducer as claimed in claim 1 wherein the light transmitting element is employed as or in conjunction with a sensing element and wherein the optical fibre that defines the second light path is wound as a coil which forms a reference light path.

5. The transducer as claimed in claim 1 wherein the modulating means is arranged to effect square wave modulation of the light source.

6. The transducer as claimed in claim 1 wherein the light transmitting element that defines the first light path has an effective path length which is shorter than the length of the optical fibre that defines the second light path by a factor in the order of 2,500 to 25,000.

7. The transducer as claimed in claim 1 wherein the light transmitting element that defines the first light path is terminated by a mirror surface which is arranged to reflect light that is directed into the light transmitting element from the light source.

8. A current sensor comprising: a sensor element in the form of a coil of optical fibre which is arranged in use to surround a current carrying conductor, a light transmitting device connected with the ends of the coil-forming optical fibre and arranged to launch counter-propagating light beams into the respective ends of the coil-forming optical fibre, a light source connected optically in circuit with the light transmitting device, means for cyclically modulating the light from the source between upper and lower levels, a detector which is arranged to detect a phase shift between the polarisation modes of the counter-propagated light beams connected to the ends of the coil-forming optical fibre by way of the light transmitting device, a light transmitting element defining a reference light path and connected optically to the light source and the detector, the light transmitting element which forms the reference light path having an effective path length that is significantly smaller than the length of the coil-forming optical fibre whereby light which exits from the coil and the reference light path will be detected during successive time periods that include a first time interval in which light exits from the reference light path only and a second time interval in which light exits only from the coil, and the detector being arranged to reference the level of light that exits from the coil during the second interval of each time period with respect to the level of light that exits from the reference light path during the first interval of each time period.

9. The current sensor as claimed in claim 8 wherein the light transmitting element that defines the reference light path comprises a length of optical fibre.

10. The current sensor as claimed in claim 8 or claim 9 wherein the modulating means is arranged to effect square wave modulation of the light source.

11. The current sensor as claimed in claim 8 wherein the light transmitting element that forms the reference light path has an effective path length which is shorter than the length of the coil-forming optical fibre by a factor in the order of 2,500 to 25,000.

12. The current sensor as claimed in claim 8 wherein the coil-forming optical fibre comprises spun birefringent optical fibre.

13. The current sensor as claimed in claim 8 wherein the optical fibre that forms the light transmitting element comprises standard single mode fibre.

14. The current sensor as claimed in claim 8 wherein the light transmitting device comprises a 3×3 coupler which is arranged with the detector to recombine and process with a 120° phase relationship light that has counter-propagated through the coil.

15. The current sensor as claimed in claim 8 wherein a 2×2 coupler is connected in circuit with the 3×3 coupler and is arranged to direct light from the light source to the ends of the coil-forming optical fibre by way of the 3×3 coupler.

16. The current sensor as claimed in claim 8 wherein the light transmitting element that defines the reference light path is connected between the 2×2 coupler and the 3×3 coupler.

17. The current sensor as claimed in claim 8 wherein the light transmitting element that defines the reference light path is terminated by a mirror surface which is arranged to reflect to the detector light that is directed into the light transmitting element from the light source.

* * * * *

UNITED STATES PATENT AND TRADEMARK OFFICE
CERTIFICATE OF CORRECTION

PATENT NO. : 6,034,522
DATED : Mar. 7, 2000
INVENTOR(S) : John Haywood

It is certified that error appears in the above-identified patent and that said Letters Patent is hereby corrected as shown below:

Title page, after "PCT Filed:", change "Mar.", to --May--.

Title page, after "§ 371 Date:", change "May", to --Mar--.

Signed and Sealed this

Tenth Day of April, 2001

Attest:

NICHOLAS P. GODICI

*Attesting Officer*          *Acting Director of the United States Patent and Trademark Office*